United States Patent [19]
Feist

[11] Patent Number: 4,677,456
[45] Date of Patent: Jun. 30, 1987

[54] SEMICONDUCTOR STRUCTURE AND MANUFACTURING METHOD

[75] Inventor: Wolfgang M. Feist, Burlington, Mass.

[73] Assignee: Raytheon Company, Lexington, Mass.

[21] Appl. No.: 833,574

[22] Filed: Feb. 25, 1986

Related U.S. Application Data

[60] Continuation of Ser. No. 258,841, Apr. 29, 1981, abandoned, which is a division of Ser. No. 42,686, May 25, 1979, Pat. No. 4,289,550.

[51] Int. Cl.$^4$ ..................... H01L 27/04; H01L 29/06
[52] U.S. Cl. ........................................ 357/50; 357/20; 357/34; 357/55; 357/60; 148/DIG. 10; 148/DIG. 51; 148/DIG. 85; 148/DIG. 117; 148/DIG. 124; 148/DIG. 145
[58] Field of Search ..................... 357/20, 34, 50, 55, 357/60

[56] References Cited

U.S. PATENT DOCUMENTS

| 3,083,441 | 4/1963 | Little | 357/55 |
| 3,648,125 | 3/1972 | Peltzer | 357/50 |
| 3,755,001 | 8/1973 | Kooi | 148/175 |
| 3,783,047 | 1/1974 | Paffen | 148/1.5 |
| 3,878,552 | 4/1975 | Rogers | 357/60 |
| 4,040,084 | 8/1977 | Tanaka et al. | 357/55 |
| 4,040,878 | 8/1977 | Rowe | 357/55 |
| 4,066,073 | 1/1978 | O'Brien | 148/1.5 |
| 4,110,779 | 8/1978 | Rathbone | 357/55 |
| 4,115,797 | 9/1978 | Hingarh | 148/187 |
| 4,155,783 | 5/1979 | Feist | 156/647 |
| 4,168,999 | 9/1979 | Vora | 357/50 |

FOREIGN PATENT DOCUMENTS

| EP 114 | 1/1979 | European Pat. Off. . |
| 1137372 | 12/1968 | United Kingdom . |
| 1300033 | 12/1972 | United Kingdom . |
| 1345584 | 1/1974 | United Kingdom . |

OTHER PUBLICATIONS

IEEE Trans. Electron Dev., vol. ED 25, No. 10, Oct. 1978, p. 1237.

Primary Examiner—William D. Larkins
Attorney, Agent, or Firm—Peter J. Devlin; Richard M. Sharkansky

[57] ABSTRACT

A semiconductor structure is provided by forming an isolation region in a portion of a semiconductor layer, forming a doped region in the semiconductor layer adjacent the isolation region, such doped region having a conductivity type opposite the conductivity type of the semiconductor layer, selectively masking a surface of the semiconductor layer exposing a portion of the doped region adjacent to the isolation region, and selectively etching the exposed portions of the adjacent doped region forming a depression having converging side walls separated from the isolation region by portions of the doped region. The semiconductor layer is an epitaxial layer providing the collector region of a transistor. The bottom portion of the depression is lightly doped to provide an active base region for the transistor. The active base region is electrically connected to the base contact through the more heavily doped region formed in the semiconductor layer. A doped polycrystalline silicon layer is formed over the bottom portion of the depression in contact with the active base region to provide an emitter contact for the transistor.

4 Claims, 24 Drawing Figures

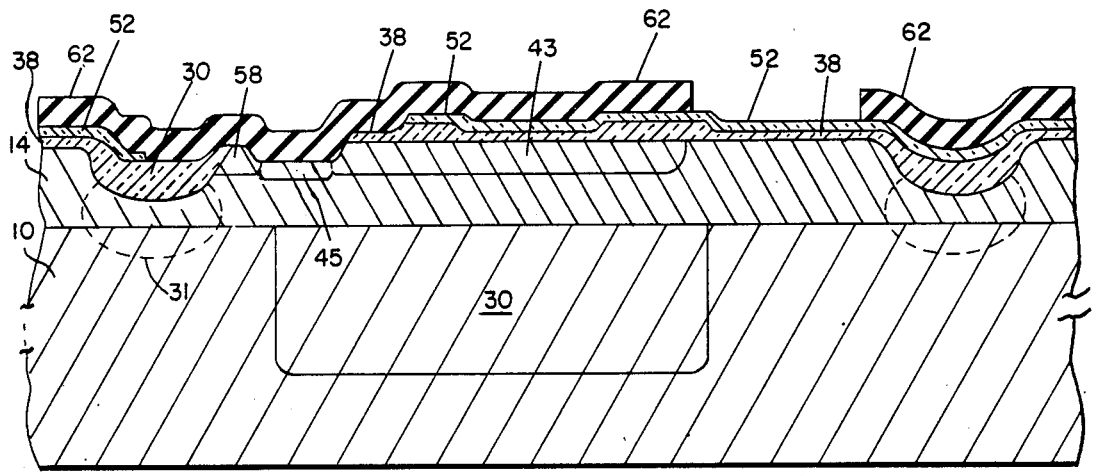
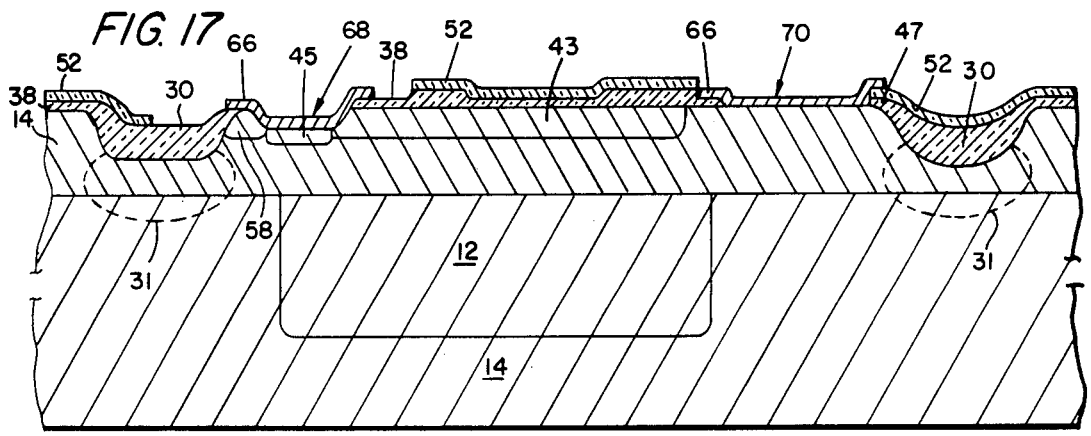
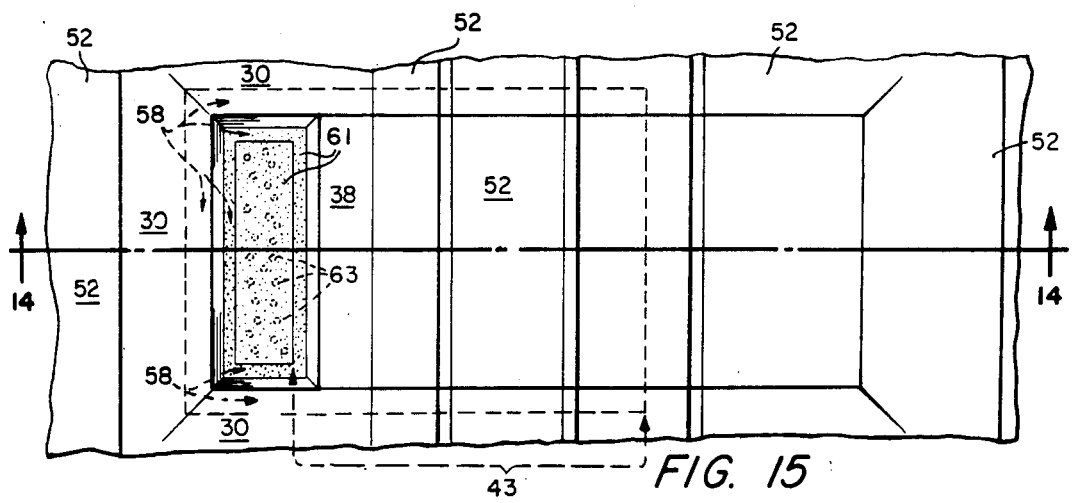

SEMICONDUCTOR STRUCTURE AND MANUFACTURING METHOD

This application is a continuation of prior application Ser. No. 258,841, filed Apr. 29, 1981, now abandoned, which is a divisional of Ser. No. 042,686, filed on May 25, 1979, now U.S. Pat. No. 4,289,550.

BACKGROUND OF THE INVENTION

This invention relates generally to semiconductor structures and manufacturing methods and more particularly to bipolar transistor structures and manufacturing methods.

As is known in the art, one technique used in the formation of bipolar integrated circuit transistors is to provide an n-type conductivity epitaxial layer on a p-type conductivity silicon substrate. The transistors are formed in the epitaxial layer and are electrically isolated from each other by silicon dioxide isolation regions which are formed in the epitaxial layer around the active devices. The epitaxial layer provides the collector region for the transistor. A p-type conductivity region is generally diffused into the epitaxial layer to form the base region for the transistor. The emitter region is generally formed by diffusing an n-type conductivity region into the p-type conductivity base region.

In order to reduce the amount of surface area required for the transistor a portion of the p-type conductivity base region is bounded by the silicon dioxide isolation region. In such a transistor the emitter region is formed entirely within the base region since extension of the emitter region to the silicon dioxide isolation region may cause the emitter region to become electrically short-circuited to the collector region. In particular, if a portion of the emitter region in such transistor extended to the silicon dioxide isolation region, charges in the silicon dioxide may cause an inversion of the more lightly doped, bottom portion of the p-type conductivity diffused base region adjacent the silicon dioxide isolation region. This inversion results in an n-type conductivity channel being formed through such lightly doped portion of the base region between the underlying n-type conductivity epitaxial layer (which forms the collector region) and the n-type conductivity emitter region. To prevent this channel, and hence short circuit, from being formed between the emitter and collector the emitter region is generally formed totally within the upper, more heavily doped, portion of the base region. This upper, more heavily doped, portion of the base region, while extending to the silicon dioxide isolating region, is disposed between the emitter region and the isolation region to inhibit inversion caused by charges in the silicon dioxide isolation region and thereby prevent an n-type conductivity channel, a short circuit, from being created between the epitaxial layer and the emitter region. Since the emitter region is formed totally within the base region, however, an increased area is required to form the transistor, thereby reducing the number of active devices which may be formed in a silicon chip.

SUMMARY OF THE INVENTION

In accordance with the present invention, a semiconductor structure is provided by forming an isolation region in a portion of a semiconductor layer, forming a doped region in the semiconductor layer adjacent the isolation region, such doped region having a conductivity type opposite the conductivity type of the semiconductor layer, selectively masking a surface of the semiconductor layer exposing a portion of the doped region adjacent to the isolation region and selectively etching the exposed portions of the adjacent doped region forming a depression having converging side walls separated from the isolation region by portions of the doped region.

In a preferred embodiment of the invention the isolation region includes silicon dioxide and the depression is formed by applying an anisotropic etchant to the exposed portions of the doped region so that the side walls of the depression are separated from the silicon dioxide isolation region by a portion of the doped region having a generally triangular-shaped cross section. The semiconductor layer is an epitaxial layer providing the collector region of a transistor. The bottom portion of the depression is lightly doped to provide the active base region. The active base region is electrically connected to the base contact through the more heavily doped region formed in the semiconductor layer. A doped polycrystalline silicon layer is formed over the bottom portion of the depression in contact with the active base region to provide an emitter contact for the transistor. The emitter contact is electrically isolated from the collector region by the generally triangular-shaped, more heavily doped region. In this way electrical charges in the silicon dioxide isolation region, or charges induced in the silicon by the emitter contact (or other metal interconnect) extending over the isolation region will not cause a conducting channel or electrical short circuit between the emitter contact and the portion of the semiconductor layer which provides the collector region for the transistor. Therefore, the emitter contact can come into direct contact with the isolation region, thereby reducing the area required for the transistor and facilitating in its fabrication.

BRIEF DESCRIPTION OF THE DRAWINGS

The foregoing features of this invention, as well as the invention itself, may be more fully understood from the following detailed description read together with the accompanying drawings, in which:

FIGS. 1 through 3, 4 through 11, and 12, 13, 14 and 16 through 19 are cross-sectional elevation views of a portion of a bipolar transistor according to the invention at various steps in the manufacture thereof; and FIG. 15 is a plan view of the bipolar transistor at one step in the fabrication thereof, FIG. 14 being a cross-sectional elevation view taken along line 14—14 of FIG. 15.

DESCRIPTION OF THE PREFERRED EMBODIMENTS

Figure 1:
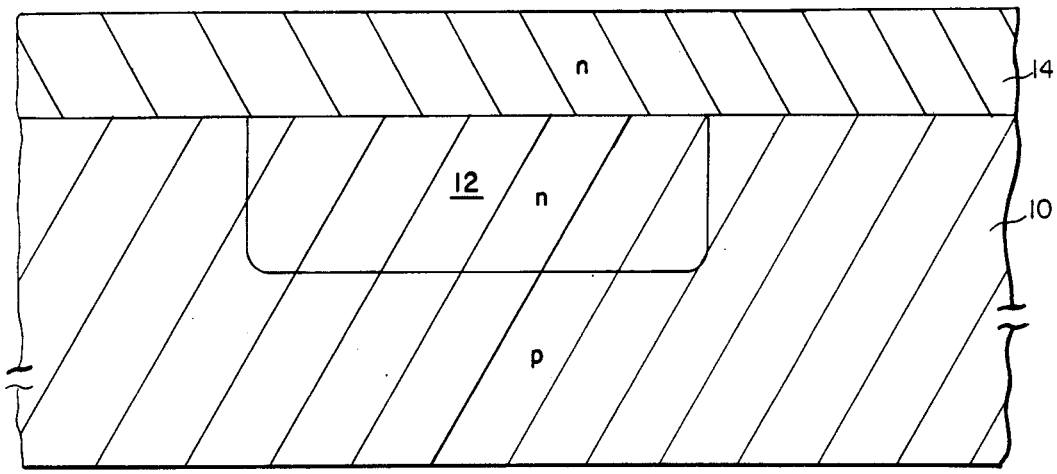

Referring now to FIG. 1, a substrate 10, here p-type silicon, having a surface in the <100> crystallographic plane and a resistivity of 10 to 40 ohm-cm is shown having a n-type conductivity subcollector region 12 formed therein using any conventional process, here ion implanting arsenic (or antimony) through a silicon dioxide or photoresist mask (not shown). Alternatively, such subcollector region 12 may be formed by diffusion. After stripping the silicon dioxide or photoresist mask by conventional techniques an epitaxial layer 14 of n-type conductivity silicon is grown. Such epitaxial layer 14 is here grown to a thickness of 2.5 to 3 micro-meters ($\mu$m).

Figure 2:
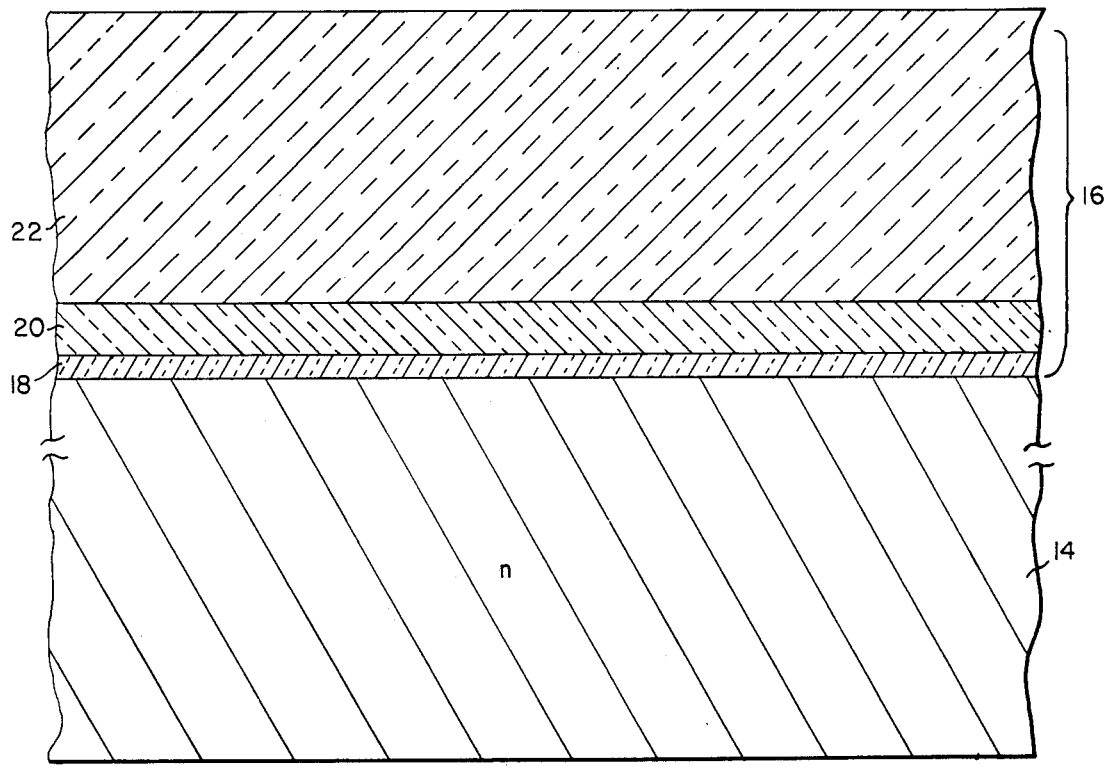

Referring now to FIG. 2, a composite layer 16 is formed over the surface of epitaxial layer 14. In particular, such composite layer 16 includes: A layer 18 of silicon dioxide, here thermally grown, or chemically vapor deposited, over the surface of the epitaxial layer 14 to a thickness, here 500 to 800 Å; a silicon nitride layer 20 deposited, here chemically vapor deposited, over the surface of silicon dioxide layer 18, here to a thickness in the order of 1500 Å; and a layer 22 of silicon dioxide is chemically vapor deposited over the layer 20 of silicon nitride, here to a thickness of 6000 to 10,000 Å.

Figure 3:
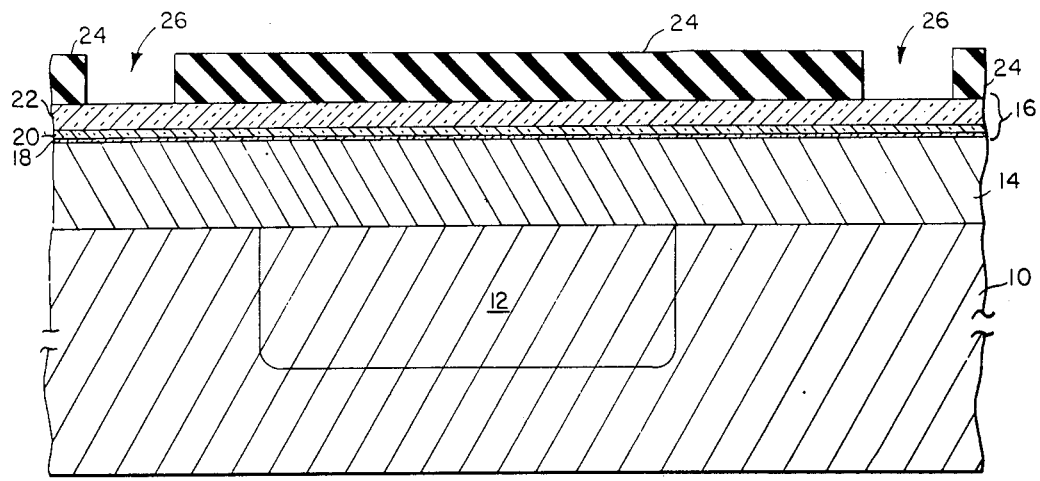
Figure 4:
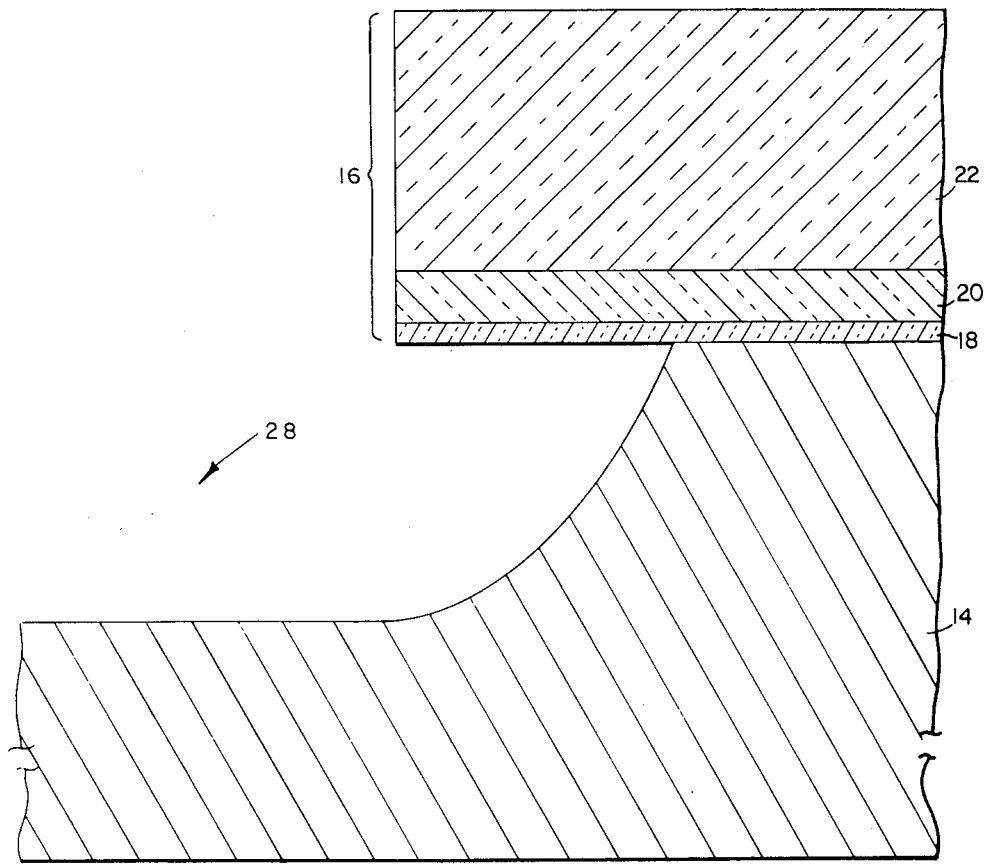
Figure 3A:
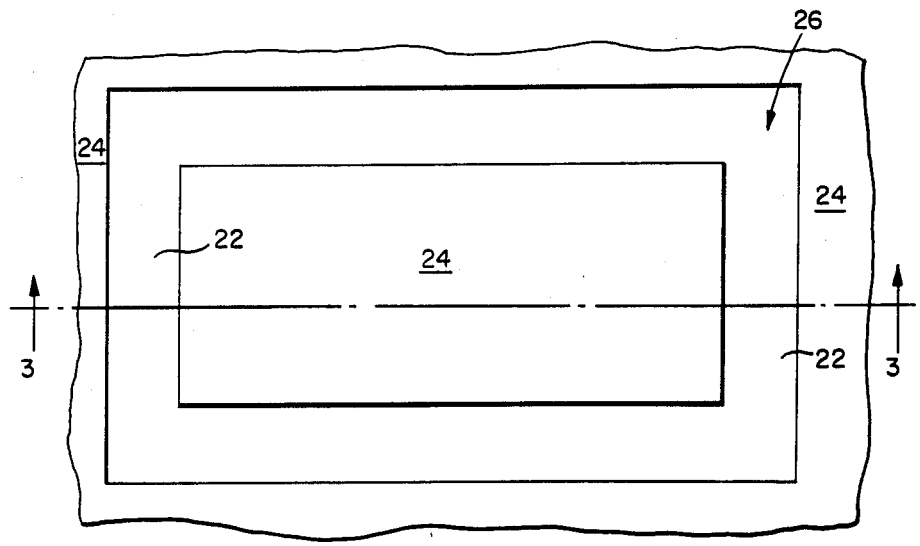
FIG. 3A is a plan view of the bipolar transistor at one step in the fabrication thereof, FIG. 3 being a cross-sectional elevation view taken along line 3—3 of FIG. 3A.

Referring now to FIGS. 3 and 3A, a layer 24 of photoresist is deposited over the composite layer 16 and is patterned into an isolation mask using conventional photolithographic chemically etching techniques, to form isolation windows 26, as shown. Preferably the widths of such isolation windows 26 are as small as practical, here in the order of 2.5 micro-meters of $\mu$m. Using the photoresist mask the exposed portions of the thick silicon dioxide layer 22 are removed using plasma etching, particularly using the so-called parallel plate system to obtain vertical walls in silicon dioxide layer 22 without undercutting of the photoresist. Alternatively, ion milling, back sputtering, or chemical etching using a solution of 6.4% HF, 35% $NH_4F$, and 58.6% $H_2O$ at a reduced temperature (below 10° C.) may be used. Using the photoresist mask and the etched layer 22 of silicon dioxide as a mask, the layer 20 of silicon nitride is here selectively etched, as shown, in a plasma etcher or by using hot phosphoric acid. The thin layer 18 of silicon dioxide is selectively etched using the photoresist, the etched silicon dioxide layer 22, and the etched silicon nitride layer 20 as masks. The photoresist layer 24 is then removed in any conventional manner. Using the selectively etched composite layer 16 as a mask, isolation grooves 28 are etched into the epitaxial layer 16 as shown in FIG. 4. If a nearly planar structure is desired and the epitaxial layer 14 is no more than 3 $\mu$m thick, the isolation grooves 28 are etched to a depth of 7500 to 8500 Å using a conventional isotropic etchant, as a solution containing nitric acid, hydrofluoric and acetic acid. For a thicker epitaxial layer 14, i.e. 3.5 to 4 $\mu$m, the etching is carried to a depth of 1.6 to 2 $\mu$m using a combination etching technique. That is, first 0.3 $\mu$m to 0.5 $\mu$m of the silicon epitaxial layer 14 is etched using an anisotropic etchant and the remaining 1.3 to 1.7 $\mu$m of the epitaxial layer 14 are selectively removed using an isotropic etchant. This latter method yields isolation grooves with sloped side walls if it is not practical to backfill the entire isolation groove with thermally grown silicon dioxide upon which metallization will be formed as described in copending patent application Ser. No. 911,659 filed June 1, 1978 and assigned to the same assignee as the present invention. Since the anisotropic etch preferably attacks the <100> crystallographic axis, a silicon substrate 10 (FIG. 1) having a surface in the <100> crystallographic plane is required in such method with the isolation groove patterns to be etched aligned along the <110> crystallographic axis.

Referring again to FIG. 4, here an isotropic etchant is used to form the isolation groove 28, as shown. During the etching with the isotropic etchant portions of the silicon epitaxial layer 14 are removed under the composite layer 16, such composite layer 16 providing the etch resistant mask for the isotropic etchant, as shown. That is, during the isotropic etching process the composite layer 16 of silicon dioxide layer 22, silicon nitride layer 20 and silicon dioxide layer 18 (FIG. 2) overhangs the side walls of the isolation groove 28 formed in the epitaxial layer 14. (In this regard in the use of the combination etching process referred to above the anisotropic etch is used to initially form the side walls in the <111> plane and the isotropic etch, subsequently applied to the initially anisotropically etched isolation grooves, is used to remove portions of the silicon epitaxial layer 14 under the composite layer 16 so that even when the combination etch method is used the composite layer 16 will overhang the side walls of the finally formed isolation grooves.)

Figure 5:
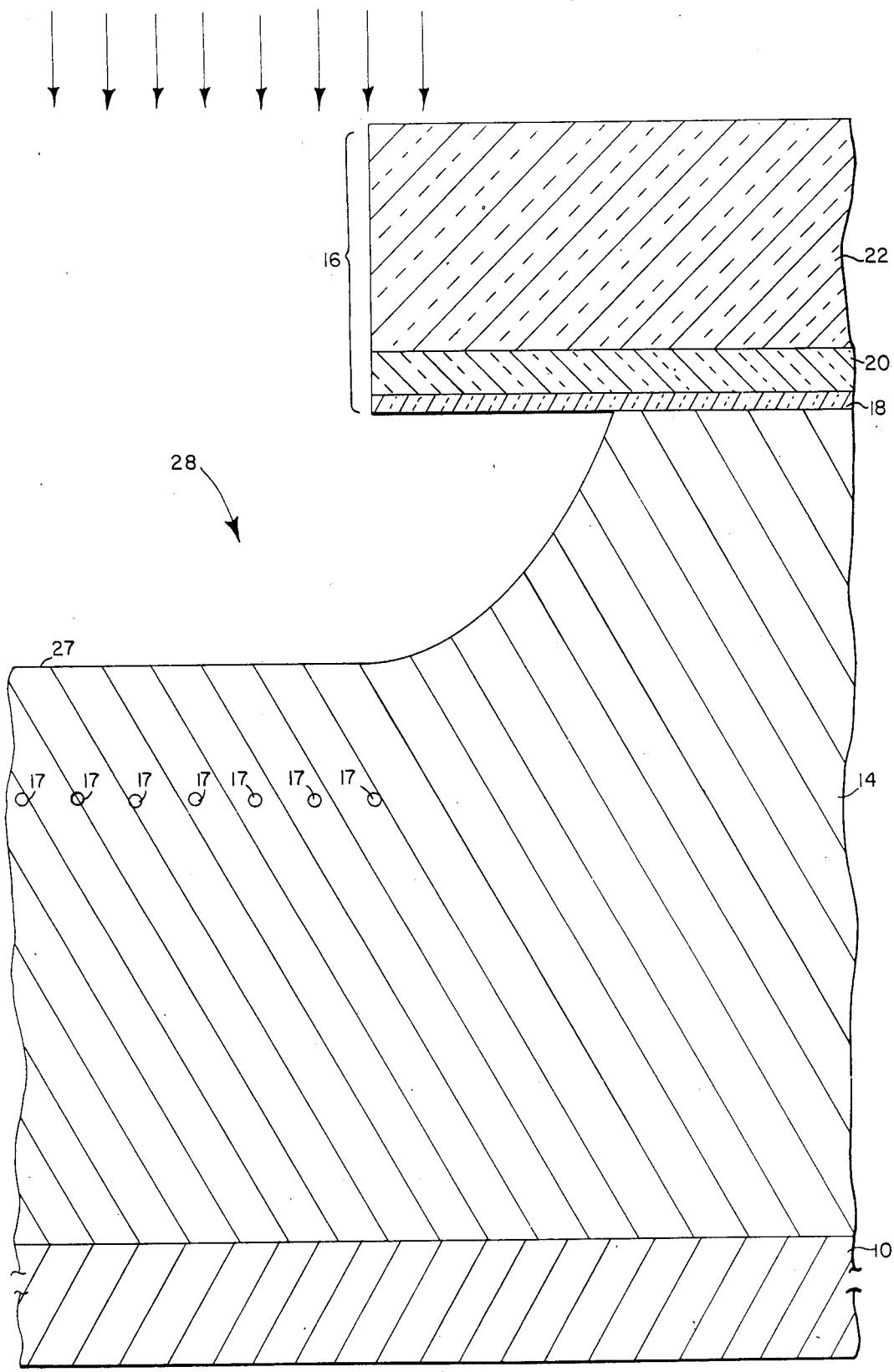

Referring now to FIG. 5, the composite layer 16 is used as an ion implantation mask. In particular, the surface of the structure thus formed is exposed to boron ions 17 (or other particles capable of providing a p-type conductivity region in the n-type conductivity epitaxial layer 14). Here the ion implantation dosage is $1.5 \times 10^{14}/cm^2$ at 150 Kev to 250 Kev so that the range of peak concentration of the implantation is at a depth from the surface of the exposed epitaxial layer 14 in the order of 4500 to 7500 Å. It is noted that the overhang portion of the composite layer 16 shields the side walls of the isolation groove 28 from the boron ions. It is also noted that since the isolation grooves 28 will be thermally oxidized to fill such grooves in a manner to be described to provide a substantially planar surface for metallization which passes over the surface of the structure, and over the filled groove to electrically interconnect devices formed in the structure, the peak of the boron implantation distribution should preferably be located at a depth at or near (i.e. to within 300 Å) the final silicon dioxide-epitaxial layer interface. In this way the oxidation of the silicon of epitaxial layer 14, to be described, does not remove substantial amounts of the boron dopant and the final structure has a proper boron, p-type conductivity, in the region of the epitaxial layer 14 beneath the bottom portion of the groove 28 to provide a structure with minimum inversion possibility. Therefore, the range of peak boron concentration in the epitaxial layer 14 should preferably be 0.45 to 0.75 $\mu$m beneath the bottom wall 27 of the groove 28.

Figure 6:
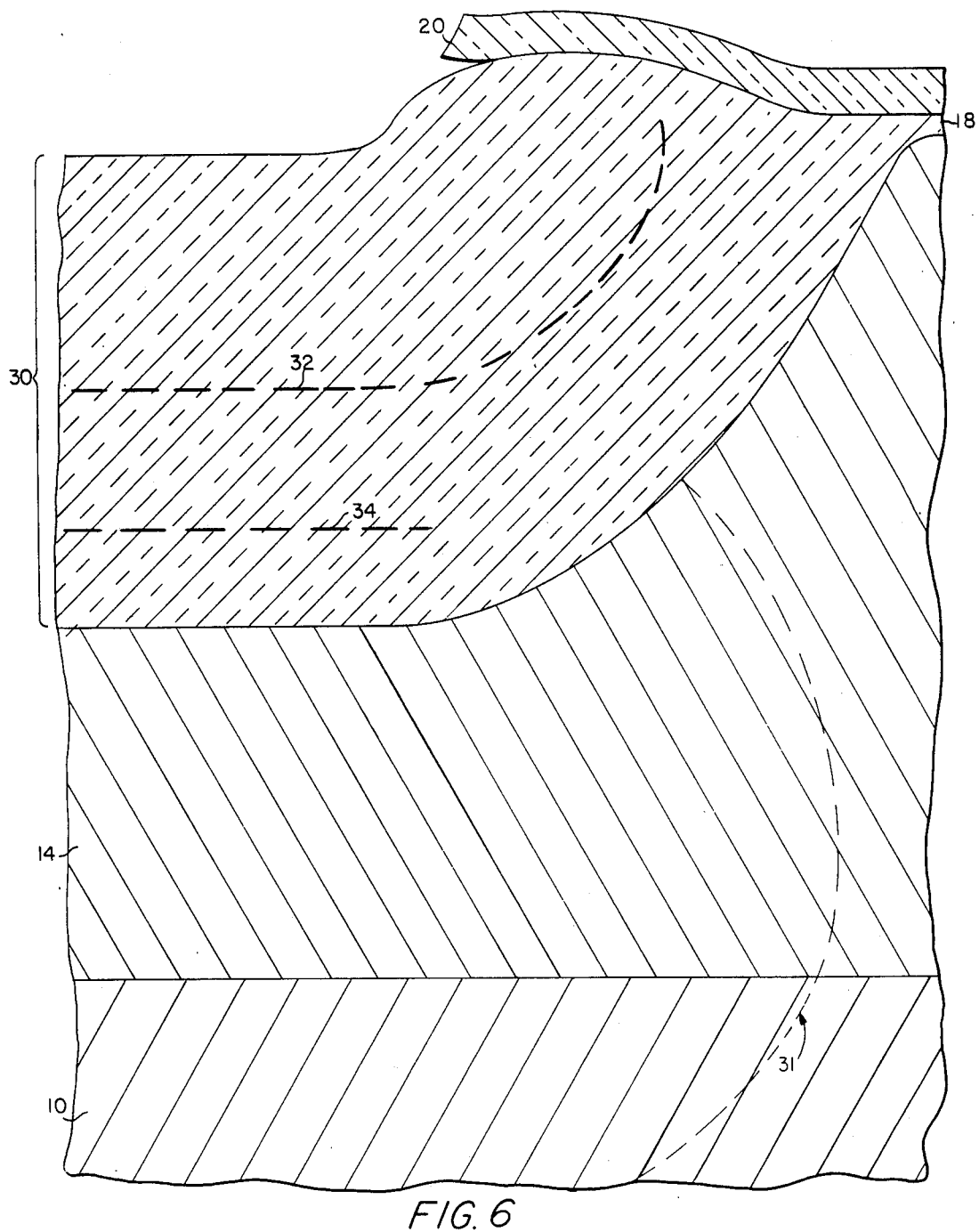
Figure 7:
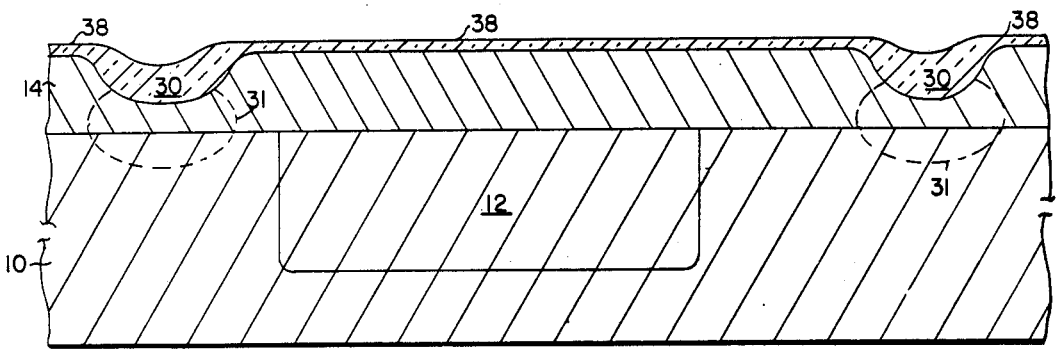

After an anneal at 1000° C. for 20 minutes in an argon atmosphere, the upper, thicker silicon dioxide layer 22 is etched away in any conventional manner. The structure thus formed is placed in an oxidizing atmosphere so that a layer 30 of silicon dioxide is thermally grown selectively over the exposed portions of the silicon epitaxial layer 14, as shown in FIG. 6. In particular, the isolation grooves 28 (FIG. 5) are selectively oxidized in a clean, wet $O_2$ atmosphere (with HCl added) to grow a layer 30 (FIG. 6) of silicon dioxide 1.2 $\mu$m to 1.5 $\mu$m thick. Typically the oxidation cycle lasts for 8 hours at 1000° C. During this oxidation (and later heating cycles to be described) portions of the implanted boron particles diffuse through the silicon epitaxial layer 14 into the substrate 10 to form a doped region 31, as shown. With an initial isolation groove depth of 8000 Å and growing a 1.5 μm thick silicon dioxide layer 30, for example, the boron region 31, cuts through the remainder of a 3 μm thick epitaxial layer 14 into the substrate 10 to provide the desired isolation region, as shown. For a thicker epitaxial layer 14 one may use additional up-diffusion of boron placed into selected regions of the substrate prior to the formation of the epitaxial layer 14. This up-diffusion will then meet with the down-diffusion of the implanted boron resulting in an increased depth of isolation. For a transistor structure it is important that the lateral diffusion of the boron implanted into the isolation grooves is small so that the boron remains well separated from the base region of the transistor to be formed later. The lateral diffusion occurs at a substantially lower rate than the downward diffusion thereby inherently facilitating the separation of the isolation boron from the base region of the transistor to be formed. This condition is achieved by the phenomenon of oxidation enhancement of diffusivity which, up to a temperature of about 1000° C., causes the boron to diffuse sufficient faster under an area where the oxide is grown, particularly in the <100> cystallographic direction. It is noted that the dotted line 32 shows the initial isolation groove 28 (FIG. 5) formed in the silicon epitaxial layer 14, while the dotted line 34 shows the peak concentration depth of the initial boron ion implantation. The silicon nitride layer 20 is then stripped using any conventional technique and is replaced with a 3500 Å thick layer 38 of silicon dioxide, here such layer 38 being grown in steam at 1000° C. for approximately 80 minutes. The resulting structure with a layer 38 of silicon dioxide formed thereon is now in the order of 4000 Å thick, as shown in FIG. 7.

Figure 8:
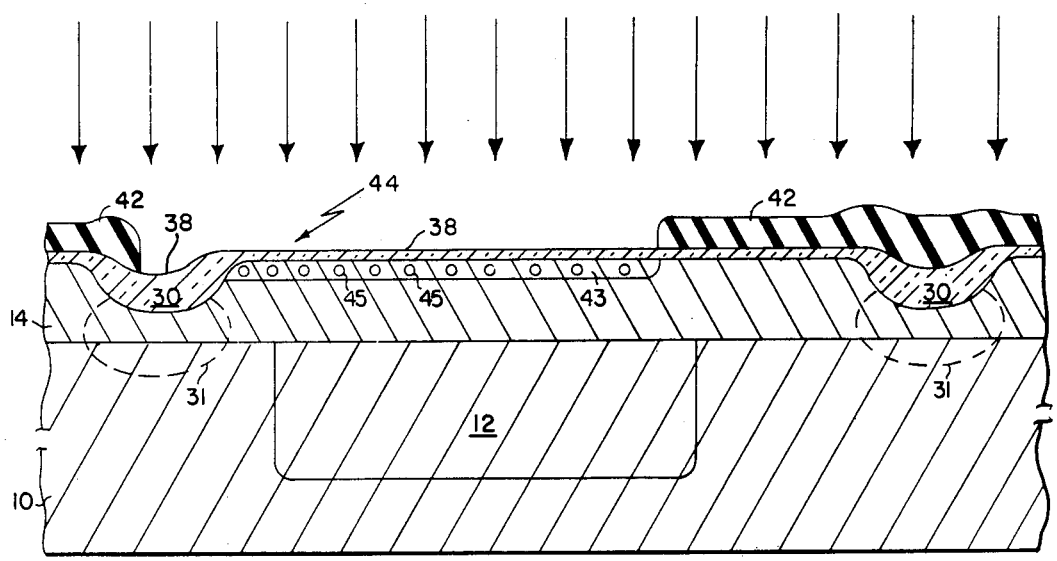

Referring now to FIG. 8, a photoresist mask from a layer 42 of photoresist is formed over the surface of the structure using conventional photolithography to provide a window 44 to expose the base region. Using this mask, boron particles 45 are ion implanted through the silicon dioxide layer 38 into the base region using a dosage, here as follows: $2 \times 10^{13}/cm^2$ at 160 Kev. The photoresist layer 42 is then removed, using any conventional process. The structure is then annealed in argon at 1100° C. for 40 minutes so that the base region spreads because of diffusion of the boron dopant to a depth in the order of 4000 Å to form the inactive base region 43 (i.e. the base region used to electrically interconnect the active base region to the base electrode, as will be discussed).

Figure 9:
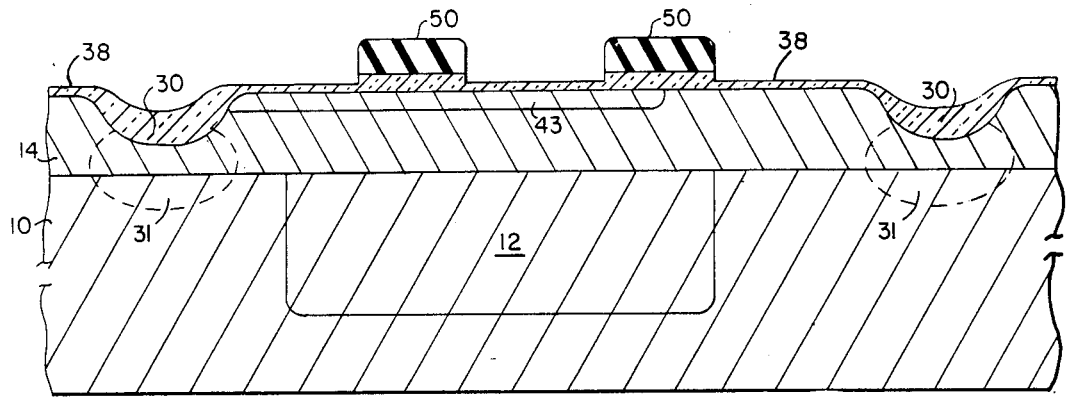

Referring now to FIG. 9, a layer 50 of photoresist is again applied to the surface of the structure and formed into a mask, as shown, using conventional photolithographic techniques. The photoresist mask is formed to expose all contact openings (emitter, base and collector) simultaneously. Using this photoresist mask portions of the silicon dioxide layer 38 (and a similar upper layer portion of the silicon dioxide in the isolation grooves) are removed to a thickness in the order of 500 to 1000 Å, as shown. Alternatively, the silicon dioxide layer 38 may be etched through to the epitaxial layer in the contact areas unmasked by the photoresist and replaced with a freshly grown silicon dioxide layer in the order of 500 Å thick. (This thin silicon dioxide layer acts as an etch stop if a silicon nitride layer, to be deposited in the next step, is subsequently etched in a plasma etcher. If a chemical etching method is used the thin layer of silicon dioxide may be omitted.)

Figure 11A:
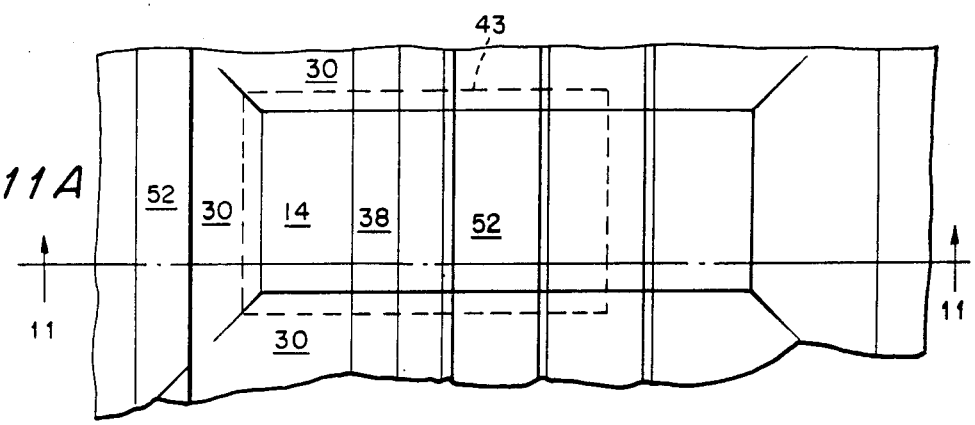
FIGS. 11A and 11B are plan and isometric views, respectively, of the bipolar transistor at one step in the fabrication thereof, FIG. 11 being a cross-sectional elevation view taken along line 11—11 of FIG. 11A.
Figure 10:
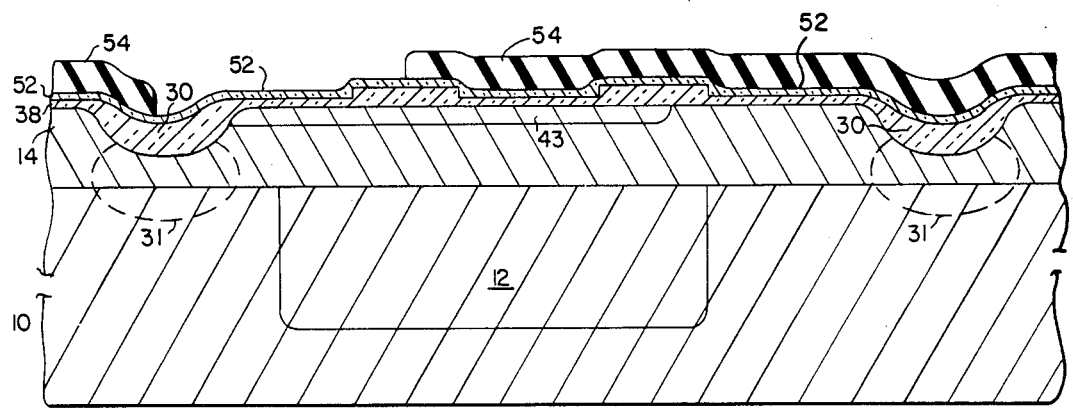
Figure 11:
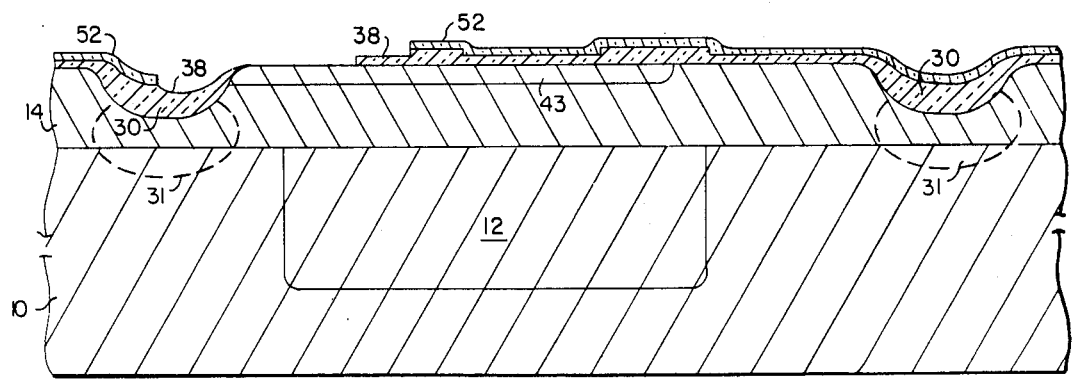
Figure 11B:
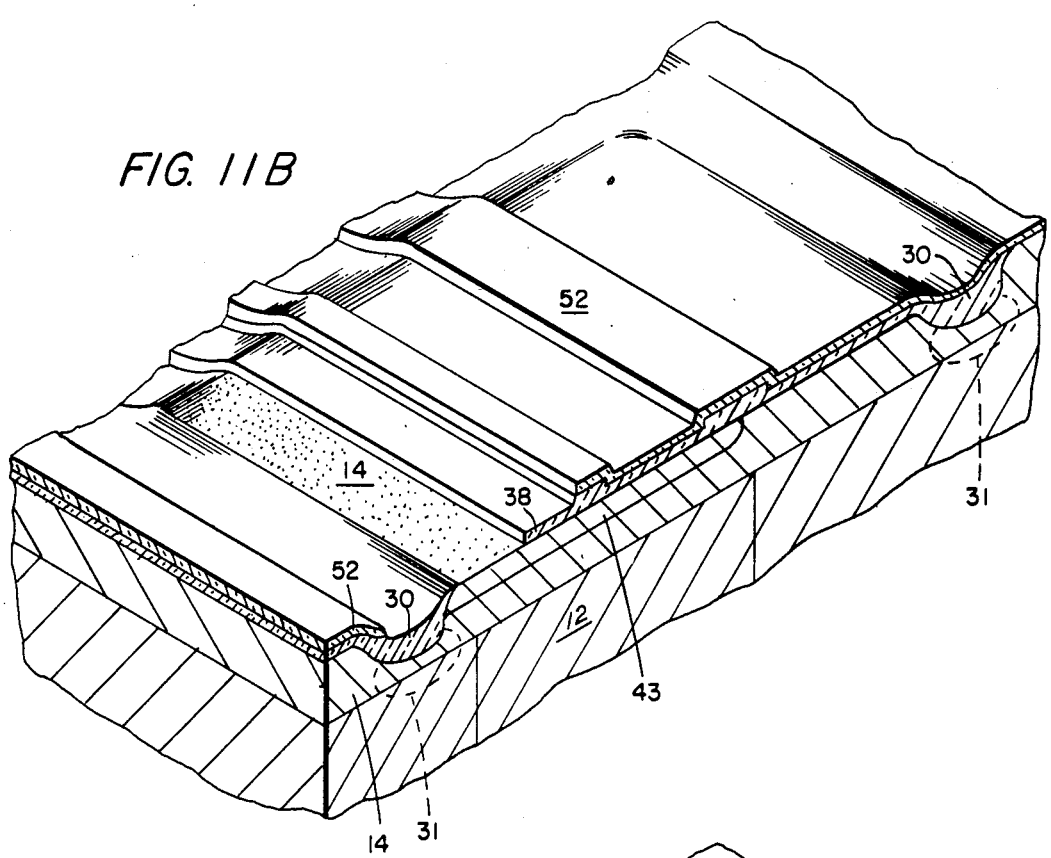

Referring now to FIG. 10, the photoresist layer 50 is removed and a layer 52 of silicon nitride is here chemically vapor deposited to a thickness of 1000 to 1500 Å. A photoresist layer 54 is then deposited over the silicon nitride layer 52 and formed into a mask, as shown, using conventional photolithographic techniques. This non-critical oversized mask is used to selectively remove the exposed portions of the silicon nitride layer 52 and the then exposed underlying thinned silicon dioxide layer 38 from the emitter area using conventional wet chemical etching processes, as shown in FIG. 10, to form the structure shown in FIGS. 11, 11A and 11B after the photoresist layer 54 is removed.

Figure 12A:
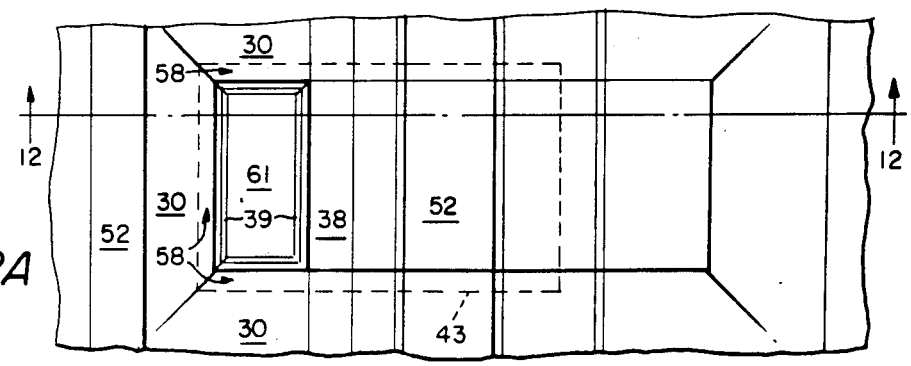
FIGS. 12A and 12B are plan and isometric views, respectively, of the bipolar transistor at one step in the fabrication thereof, FIG. 12 being a cross-sectional elevation view taken along line 12—12 of FIG. 12A.
Figure 12B:
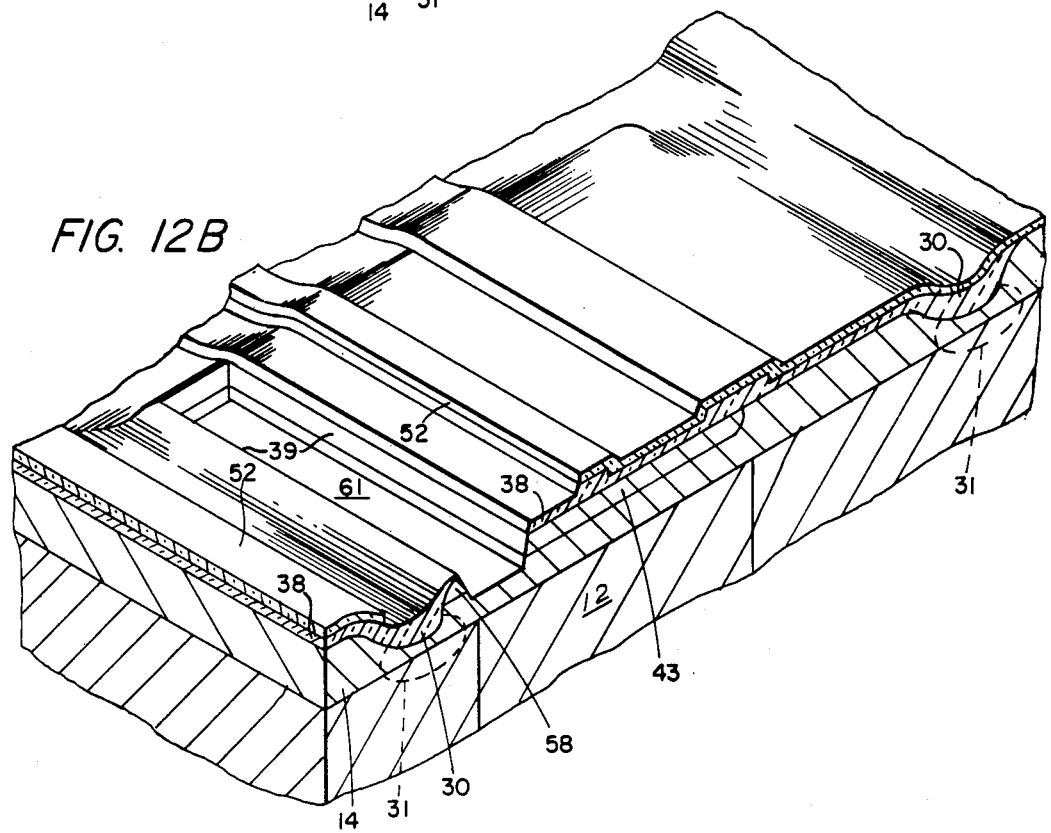
Figure 12:
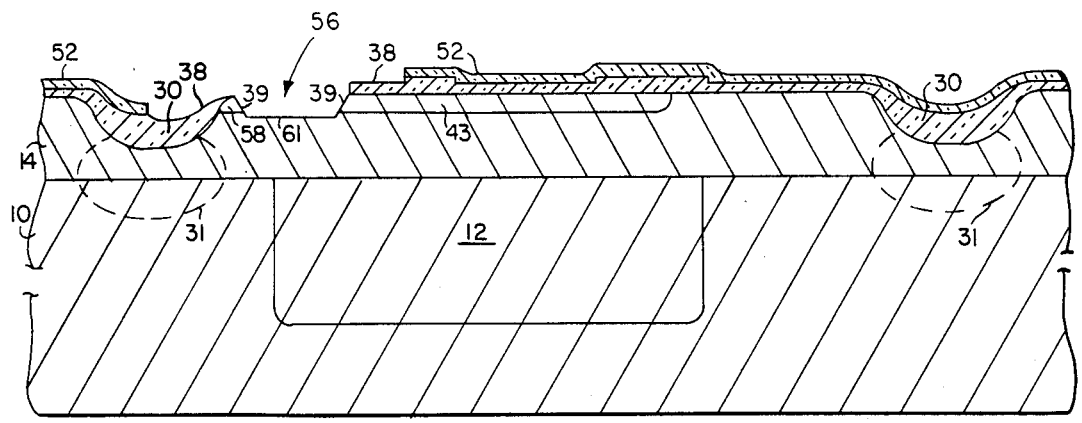
Figure 13:
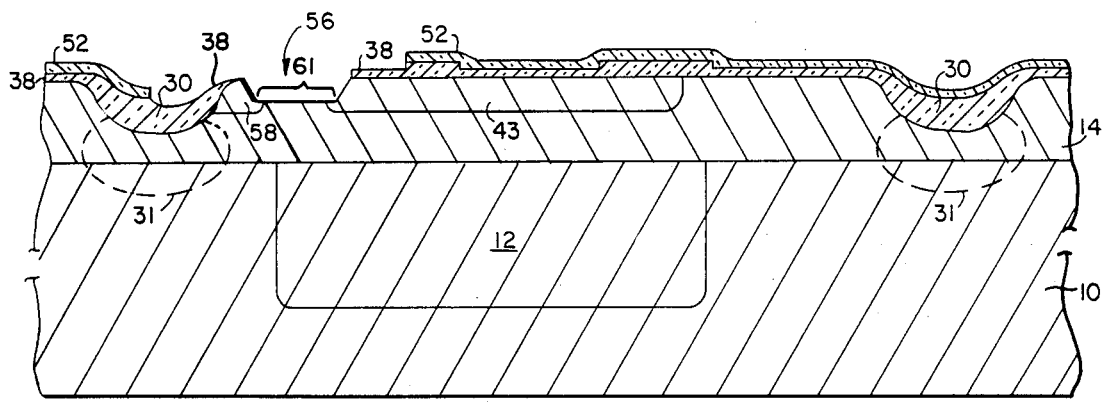

The surface of the structure is brought into contact with a suitable anisotropic etch, here pyrocatechol, to selectively remove the exposed portions of the silicon epitaxial layer 14 as shown in FIGS. 12, 12A and 12B. In particular, it should be noted that the anisotropic etch is brought into contact with the <100> surface of the epitaxial layer 14 along the <110> direction so that the side walls 39 of the depression 56 are converging and are parallel to the <111> crystallographic plane of the silicon epitaxial layer 14 and such anisotropic etch does not undercut the emitter contact opening but leaves a generally triangularly-shaped region 58, as shown, between the depression 56 and the isolation groove 30. It is also noted that the anisotropic etch removes the portions of the inactive doped base region 43 of the epitaxial layer 14, as shown. As a result, the triangularly-shaped portion 58 of the inactive base region 43 is retained between the emitter opening, i.e., depression groove 56, and the silicon dioxide filled isolation groove 30, as shown. Region 58 prevents inversion from electrically short-circuiting between the emitter and collector regions of the transistor to be formed. Without the boron doped region 58 positive charges residing in the silicon dioxide isolation groove 30 (or charges induced in the silicon by subsequent metallization formed over such silicon dioxide in a manner to be described hereinafter) can cause inversion at the silicon-silicon dioxide interface and thus cause an emitter-collector electrical short circuit by channeling. After the anisotropic etching the structure is heated in argon to 1100° C. for about 40 minutes in order to drive the inactive base region 43 deeper by in the order of 2000 Å so that it extends to a level slightly below the bottom 61 of the etched depression 56 as shown in FIG. 13, i.e. the bottom of the depressed emitter contact opening.

Figure 14:
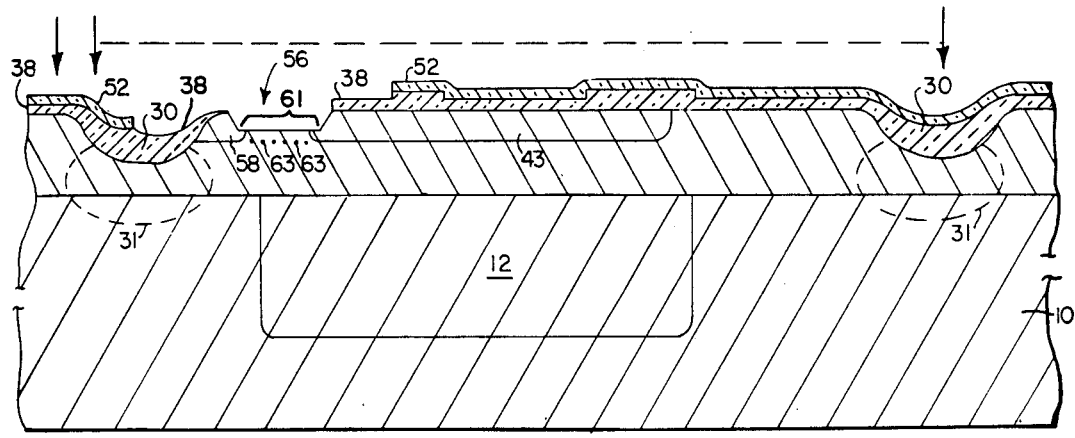

Next the active base region is formed by implanting boron ions through the emitter contact opening (i.e. depression 56) with a dosage ranging from $7 \times 10^{12}/cm^2$ to $1 \times 10^{13}/cm^2$, depending on the beta of the transistor desired, as shown in FIGS. 14 and 15. The implant is made in two steps, namely at 40 Kev and 100 Kev. If desired, a thin oxide layer (not shown) in the order of 300 to 500 Å thick may be grown or deposited on the emitter contact opening before the implant to act as a shield for undesired impurities. The structure is then heated in an argon atmosphere at 1000° C. for 20 minutes to anneal and activate the boron ions and thereby form the active base region 45 (FIG. 16). Further, the base region 43 is driven slightly further into the epitaxial layer 14 during this step.

Referring to FIG. 16, a photoresist layer 62 is deposited over the surface of the structure to form a relatively noncritical, oversized mask, as shown, to enable a selected portion of the silicon nitride layer 52 and thinned silicon dioxide layer 38 to be removed from the collector contact area, as shown, using any conventional etching technique.

Referring now to FIG. 17, a layer 66 of polycrystalline silicon is deposited, here by chemical vapor deposition (using cracking of $SiH_4$ at 600° to 700° C.), onto the surface of the structure to a thickness in the order of 2000 to 3000 Å. The deposited polycrystalline silicon layer 66 is then doped with a suitable dopant, here phosphorous, by conventional diffusion at 900° to 950° C. (Alternatively, the deposited polycrystalline silicon layer 66 may be doped by ion implantation of phosphorous or arsenic.) The temperature cycle involved in the diffusion is no longer than 20 to 25 minutes so that the diffusion into the single crystal epitaxial layer will be very shallow (less than 1000 Å), especially because the diffusion in the polycrystalline silicon layer 66 is much more rapid than in single crystal silicon. Using an oversized photoresist mask (not shown), the doped polycrystalline layer 66 is etched into emitter and collector contacts 68, 70, respectively, as shown in FIG. 17. An emitter-base junction is thus formed between the emitter contact 68 and the lightly doped, active base region 45. Note that it is desirable that the doped polycrystalline silicon emitter contact 68 extends slightly beyond the periphery of the emitter opening in order to protect the emitter-base junction.

Figure 18:
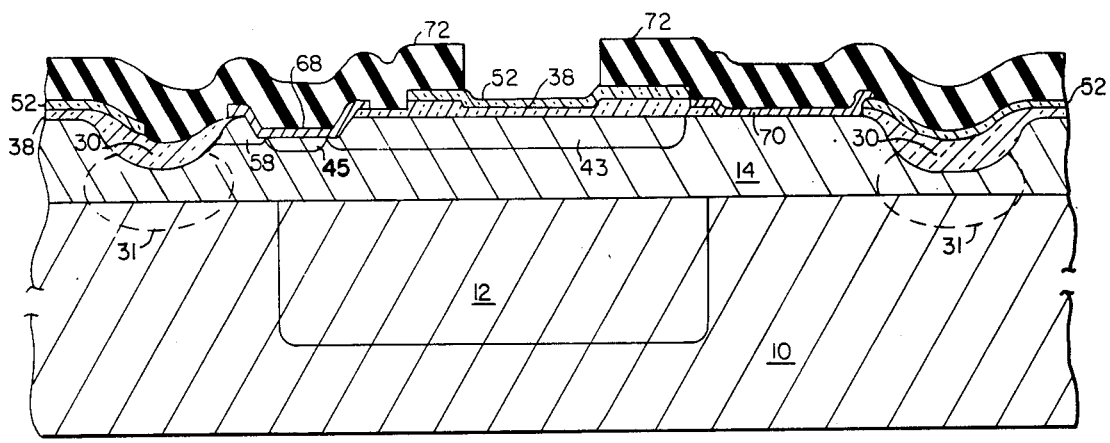
Figure 19:
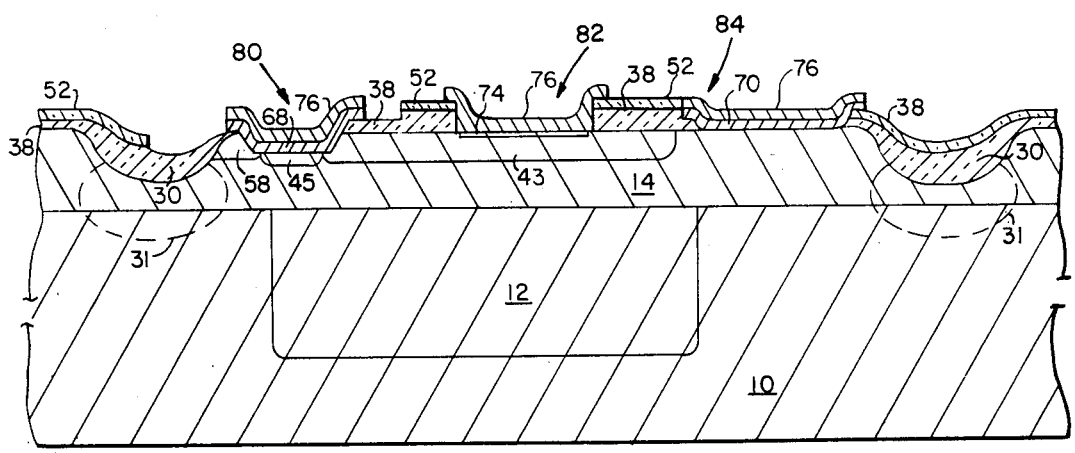

Referring now to FIG. 18, a layer 72 of photoresist is patterned, as shown, to form a mask which exposes the region where the base contact is to be formed. The exposed portions of the silicon nitride layer 52 and thinned silicon dioxide layer 38 are etched, using any conventional technique. Next, the photoresist layer 72 is dissolved. A layer of platinum is dissolved and lifted off, except from the base contact area as shown in FIG. 19. The remaining platinum is then sintered in the base contact area to form a region 74 of PtSi and the excess platinum is removed by etching in aqua regia as shown in FIG. 19 Alternatively, the PtSi may be omitted if such is not needed for the base contact. The process described may be easily modified to form PtSi simultaneously on the base contact and on portions of the collector region, as by extending the base contact window to expose portions of the adjacent collector regions to obtain a Schottky contact.

A metallization layer 76, preferably aluminum, 5000 to 7000 Å thick, is deposited over the surface of the structure and patterned into conductors (i.e. emitter, base and collector contacts 80, 82, 84, respectively), as shown in FIG. 19. Note that the oversized polycrystalline silicon emitter 68 protects the emitter junction from being shorted by the aluminum and from alloying spikes which can form in single crystal silicon in specific crystallographic orientations. It is also noted that the active base region 45 is electrically coupled to the base contct 82 through the more heavily doped inactive base region 43. It follows then that the term "active base region" refers to the p-type conductivity region which interacts with the emitter contact 68 and the term "inactive base region" refers to the p-type conductivity region which is used to electrically interconnect the active base region to the base contact 82.

Having described preferred embodiments of this invention, it is now evident that other embodiments incorporating these concepts may be used. It is felt, therefore, that this invention should not be restricted to the disclosed embodiments, but rather should be limited only by the spirit and scope of the appended claims.

What is claimed is:

1. A semiconductor structure comprising:
   (a) a semiconductor having a first conductivity type;
   (b) an isolation region of insulating material disposed in a portion of the semiconductor;
   (c) a first doped region formed in the semiconductor having a portion thereof adjacent to the insulating material, such first doped region having a first dopant concentration of a second conductivity type opposite the first conductivity type;
   (d) such semiconductor having a depression formed therein, such depression having upper side wall portions in contact with the insulating material and lower side wall portions separated from portions of the insulating material by portions of the first doped region; and
   (e) a second doped region formed in the semiconductor abutting a bottom portion of the depression, said second doped region having the second conductivity type in a dopant concentration less than the first dopant concentration.

2. A semiconductor device comprising:
   (a) a doped semiconductor body;
   (b) an isolation region of insulating material disposed in a portion of such body;
   (c) a first doped region in such semiconductor body having a conductivity type opposite that of the semiconductor body, a portion of such doped region being disposed adjacent the insulating material;
   (d) such semiconductor body having a depression formed in a surface thereof, such depression having upper side wall portions in contact with the insulating material and lower side wall portions separated from the insulating material by portions of the doped region;
   (e) a second doped region in the semiconductor body disposed beneath a bottom portion of the depression, such second doped region having a type conductivity the same as that of the first doped region, such second doped region having a doping concentration less than the doping concentration of the first doped region; and
   (f) an emitter region disposed on the bottom of the depression and forming a junction with the second doped region.

3. A transistor divice comprising:
   (a) a doped epitaxial layer disposed on a substrate;
   (b) an isolation region of insulating material disposed in a portion of the epitaxial layer;
   (c) a first doped region in the epitaxial layer having a conductivity type opposite that of the doped epitaxial layer, such first doped region having a portion disposed adjacent the insulating material;
   (d) such epitaxial layer having a depression formed in a surface thereof, such depression passing into the doped region and having upper side wall portions in contact with the insulating material and lower side wall portions separated from portions of the insulating material by portions of the first doped region;
   (e) a second doped region of conductivity type like that of the first doped region, such second doped region being disposed beneath a bottom portion of the depression;

(f) an emitter region disposed on the bottom portion of the depression and forming a junction with the second doped region; and (g) base and collector contacts in contact with the first doped region and the epitaxial layer, respectively.

4. The transistor device recited in claim 3 wherein the doping concentration of the second doped region is less than the doping concentration of the first doped region.

* * * * *